US007965098B2

(12) United States Patent
Wood et al.

(10) Patent No.: US 7,965,098 B2
(45) Date of Patent: Jun. 21, 2011

(54) HARDENED CURRENT MODE LOGIC (CML) VOTER CIRCUIT, SYSTEM AND METHOD

(75) Inventors: Neil Wood, Centreville, CA (US); David Rea, Manassas, VA (US); Bin Li, Chantilly, VA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 12/595,865

(22) PCT Filed: Dec. 10, 2008

(86) PCT No.: PCT/US2008/086291
§ 371 (c)(1),
(2), (4) Date: Oct. 14, 2009

(87) PCT Pub. No.: WO2009/076476
PCT Pub. Date: Jun. 18, 2009

(65) Prior Publication Data
US 2010/0141296 A1    Jun. 10, 2010

Related U.S. Application Data

(60) Provisional application No. 61/007,340, filed on Dec. 10, 2007.

(51) Int. Cl.
*H03K 19/003* (2006.01)
*H03K 19/096* (2006.01)
*H03L 7/00* (2006.01)

(52) U.S. Cl. .............. 326/11; 326/95; 327/144

(58) Field of Classification Search .............. 326/10, 326/11, 93, 95, 98, 115, 119, 126, 127; 327/144, 327/197–200
See application file for complete search history.

(56) References Cited

U.S. PATENT DOCUMENTS

| 4,375,683 | A | * | 3/1983 | Wensley | 714/12 |
| 5,568,097 | A | | 10/1996 | Woodman, Jr. | |
| 5,953,217 | A | * | 9/1999 | Klein et al. | 361/799 |
| 6,445,220 | B1 | | 9/2002 | Franca-Neto | |
| 6,910,173 | B2 | * | 6/2005 | Mitra et al. | 714/760 |
| 7,212,448 | B1 | * | 5/2007 | Trimberger | 365/189.02 |
| 7,288,957 | B2 | * | 10/2007 | Plants | 326/9 |
| 2007/0236246 | A1 | | 10/2007 | Roper | |

OTHER PUBLICATIONS

ISA/US, International Search Report, International Application No. PCT/US2008/086291 Filed Dec. 10, 2008, Dated Feb. 12, 2009, 1 page.
ISA/US, Written Opinion, International Application No. PCT/US2008/086291 Filed Dec. 10, 2008, Dated Feb. 12, 2009, 7 page.

* cited by examiner

*Primary Examiner* — Shawki S Ismail
*Assistant Examiner* — Dylan White
(74) *Attorney, Agent, or Firm* — Graybeal Jackson LLP; Paul F. Rusyn

(57) ABSTRACT

A current mode logic voter circuit includes three two-input split NOR gates. Each two-input split NOR gate receives a corresponding pair of input signals and generates a pair of first output signals responsive to the input signals. A three input split NOR gate is coupled to the two-input split NOR gates to receive the first output signals and generates a second pair of output signals responsive to the first output signals from the two-input split NOR gates. The two and three-input split NOR gates can be formed from current mode logic buffer circuits, and in one embodiment in the three-input split NOR gate the buffer circuits are hardened.

19 Claims, 10 Drawing Sheets

HARDENED CURRENT MODE LOGIC (CML) VOTER CIRCUIT, SYSTEM AND METHOD

PRIORITY CLAIM

The present application is a national phase application filed pursuant to 35 USC §371 of International Patent Application Serial No. PCT/US2008/086291, filed 10 Dec. 2008; which claims the benefit of U.S. Provisional Patent Application Ser. No. 61/007,340, filed 10 Dec. 2007, now expired; all of the foregoing applications are incorporated herein by reference in their entireties.

STATEMENT OF GOVERNMENT INTEREST

The invention was made with United States Government support under Contract No. DTRA01-03-D-0007/0007, awarded by the Department of Defense. The United States Government has certain rights in this invention.

TECHNICAL FIELD

Embodiments of the present invention relate generally to electronic circuitry including current mode logic that operates in environments where radiation-induced logic errors may occur.

BACKGROUND OF THE INVENTION

Integrated circuits are operated in environments where radiation-induced logic errors may occur, such as in outer space. In outer space, for example, high-energy protons or heavy ions (cosmic rays) are a type of radiation that can cause logic errors when impacting integrated circuits. In such environments, the integrated circuit is required to maintain data integrity during a single event upset ("SEU"). A single event upset is a radiation-induced error in the logic state of a signal within the integrated circuit. Such an error can result from the collision between a high-energy proton or a heavy ion and the semiconductor material that forms the integrated circuit. This type of collision produces a quantity of electron-hole pairs in circuitry within the integrated circuit that is generating the signal, with the quantity of electron-hole pairs being capable of altering the logic state of the signal.

Current mode logic ("CML") is a differential logic family intended to be utilized for the transmission of high-speed data. FIG. 1 is a simplified schematic illustrating a conventional current mode logic buffer 100 that includes two NMOS transistors 102, 104, each transistor receiving a respective one of a pair of complementary input signals A, Ab, where Ab is a signal having a voltage level corresponding to the complementary logic state of the signal A. Each of the transistors 102, 104 is connected in series with a corresponding pull-up resistor 106, 108 between a supply voltage Vdd and a current source 110. In operation, in response to the input signals A, Ab the buffer 100 generates a pair of complementary output signals Y, Yb on drain nodes of the transistors 102, 104 that are coupled to the pull-up resistors 106, 108.

A single event upset 112 is functionally illustrated in FIG. 1 and corresponds to radiation impacting the buffer 100 at the drain node of the transistor 102. The radiation corresponds to the collision of a high-energy proton, heavy ion, or other atomic particle at this node. A collision has the effect of removing charge from the drain node of the transistor 102, as is functionally represented by a current source 112 in the figure. Note that for current mode logic circuitry, which utilizes only NMOS transistors, single event upsets 112 cause only the invalid logic condition (0,0) since such an event will only have the affect of removing charge from one of the nodes in the buffer, as will be appreciated by those skilled in the art.

The effect of the single event upset event 112 on the operation of the buffer 100 of FIG. 1 is illustrated in the signal diagram of FIG. 2 showing the complementary output signals Y, Yb as a function of time during the occurrence of the event 112. As shown in FIG. 2, initially the complementary output signals Y and Yb have complementary logic levels 1 and 0, respectively, at just before a time T1. Upon occurrence of the single event upset 112 at the drain node of transistor 102, however, which occurs at the time T1 in FIG. 2, both the complementary output signals Y, Yb go low (i.e., to a logic level 0) as illustrated in the signal diagram. As a result, the single event upset 112 causes both complementary output signals Y, Yb to have the same logic state 0, which is an invalid logic condition. The output signals Y, Yb are complementary signals so the logic states (1,0) or (0,1) are valid while the logic states (0,0) and (1,1) are invalid logic conditions. Note that the buffer 100 is an inverting buffer if output signals Y, Yb are taken from the opposite drain nodes and in the description below if output signals Y, Yb are the complement of the input signals A, Ab during normal operation then the buffer 100 is assumed to be an inverting buffer, as will be appreciated by those skilled in the art.

Such invalid logic conditions may, of course, result in improper operation of electronic circuitry (not shown) of which the buffer 100 is a part. Moreover, such an invalid logic condition will be propagated by subsequent conventional current mode logic buffers 100 that receive invalid complementary output signals Y, Yb having invalid logic levels. This is seen with reference to the schematic of the buffer 100 in FIG. 1 since the buffer will generate invalid complementary output signals Y, Yb if invalid states (1,1) or (0,0) for the input signals A, Ab are received by the buffer.

FIGS. 3A-3C depict the effects of the single event upset 112 on the buffer 100 and the propagation of invalid logic conditions by such conventional buffers. FIG. 3A shows the example discussed with reference to FIGS. 1 and 2. The buffer 100 receives valid complementary input signals A, Ab of (1,0) and outputs invalid output signals Y, Yb of (0,0) due to the single event upset 112. Due to the single event upset 112, however, the output signal Y changes from 1 to a 0 such that the buffer 100 outputs the invalid logic condition (0,0). Now, assume a second buffer designated 300 in FIG. 3B downstream of the buffer 100 receives the erroneous output signals (0,0) from the buffer 100. The buffer 300 is identical to buffer 100, and so from the schematic of the buffer 100 in FIG. 1 it is seen the buffer 300 will propagate the invalid logic condition (0,0) by outputting the invalid logic condition (1,1) in response thereto. This is shown in FIG. 3B, with the buffer 300 receiving output signals (0,0) from buffer 100 and in response to these output signals the buffer 300 generates output signals (1,1). A third buffer 302 downstream from buffer 300 is shown in FIG. 3C and receives the invalid logic condition (1,1) from buffer 300 and outputs the invalid logic condition (0,0) responsive to these inputs. This example shows how conventional CML buffers propagate invalid logic conditions.

Current mode logic circuits are extremely susceptible to single event upsets, as will be appreciated by those skilled in the art. FIG. 4 illustrates a conventional triple module redundancy (TMR) approach for "hardening" current mode logic circuitry. With the TMR approach, a hardened CML voter circuit 400 is utilized in combination with triple redundancy of the actual electronic circuitry contained in the system to be protected. The actual electronic circuitry corresponds to each of the modules 402a-c in FIG. 4.

The hardened CML voter circuit 400 implements the illustrated Boolean logic function, namely Z=AB+AC+BC where Z is the output of the voter and A, B, and C are the outputs from the modules 402 a-c, respectively. Each of the outputs A, B, and C corresponds to a differential pair of outputs as discussed with reference to the buffer 100 of FIG. 1. In operation, the voter circuit 400 outputs a logic 1 for the output Z when any two outputs A, B, and C from the modules 402 a-c are equal to a logic 1. Thus, if two or more of the modules 402a-c output a logic 1 for the outputs A, B, and C then the logic 1 provided by these two modules is assumed to be correct. The rationale for this is that while a single event upset may impact one of the modules 402 a-c the probability that such a single event upset will impact more than one of the modules is extremely low.

FIGS. 5A-B illustrate conventional logic circuitry for the voter circuit 400 of FIG. 4. FIG. 5A illustrates a conventional NOR-NOR voter circuit 500 formed by three two-input NOR gates 502a-c that receive the outputs A-C from the modules 402a-c, with outputs from these three NOR gates being applied to a single three-input NOR gate 504 that generates the output Z in response thereto. FIG. 5B illustrates a conventional NAND-NAND voter circuit 506 formed by three two-input NAND gates 508a-c and a single three-input NAND gate 510 interconnected in the same way as the corresponding NOR gates in the circuit 500 of FIG. 5A. In operation, the circuits 500 and 506 operate as just described for the voter circuit 400 of FIG. 4, namely to provide a logic 1 for the output Z whenever two of the inputs A-C are a logic 1.

There is a need for improved circuits and methods of preventing single event upsets in current mode logic systems.

SUMMARY

According to one embodiment of the present invention, a current mode logic voter circuit includes three two-input split NOR gates. Each two-input split NOR gate receives a corresponding pair of input signals and generates a pair of first output signals responsive to the input signals. A three input split NOR gate is coupled to the two-input split NOR gates to receive the first output signals and generates a second pair of output signals responsive to the first output signals from the two-input split NOR gates. The two and three-input split NOR gates can be formed from current mode logic buffer circuits, and in one embodiment in the three-input split NOR gate the buffer circuits are hardened.

DETAILED DESCRIPTION

Figure 4:
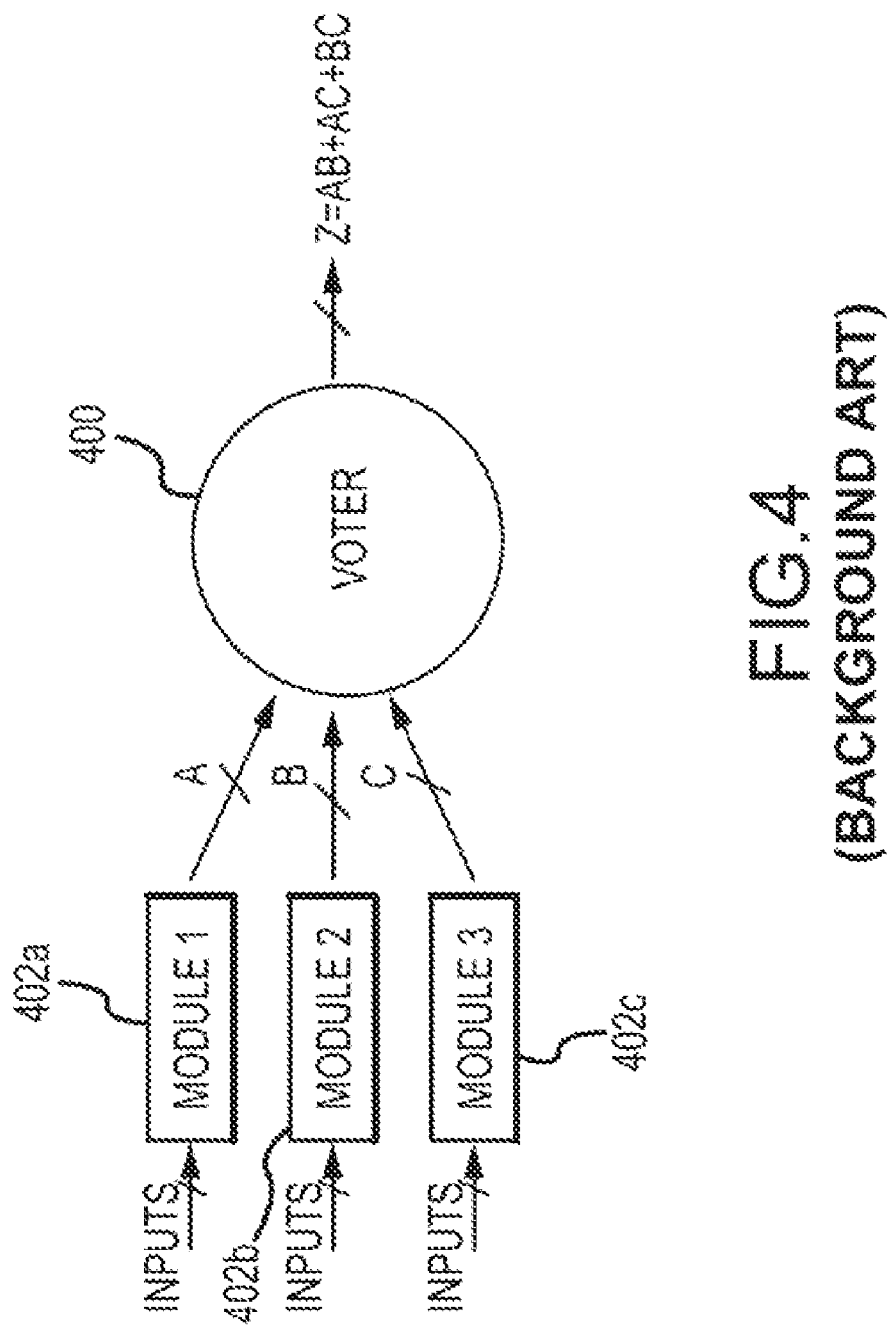
FIG. 4 is a functional block diagram of a conventional triple mode redundancy approach including a voter circuit for preventing single event upsets in current mode logic circuits.
Figure 5B:
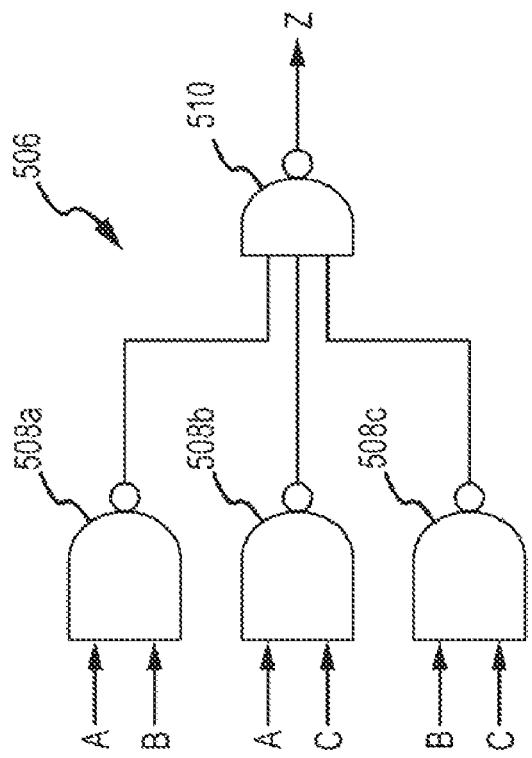
FIGS. 5A and 5B are schematics of two conventional implementations of the conventional voter circuit of FIG. 4.
Figure 5A:
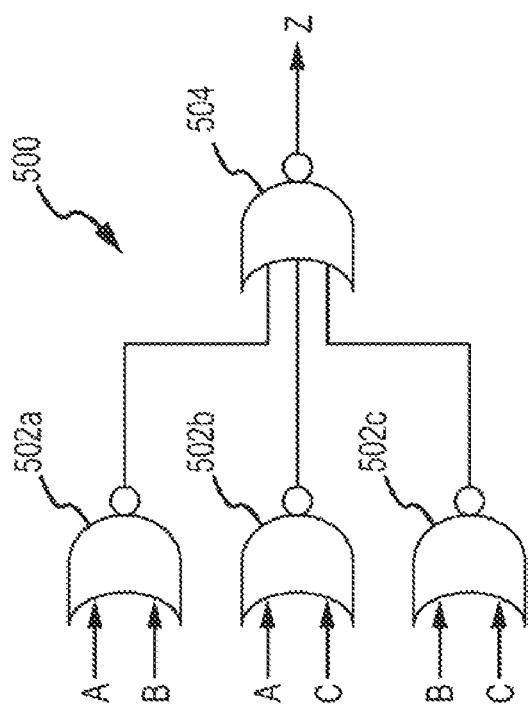
Figure 6:
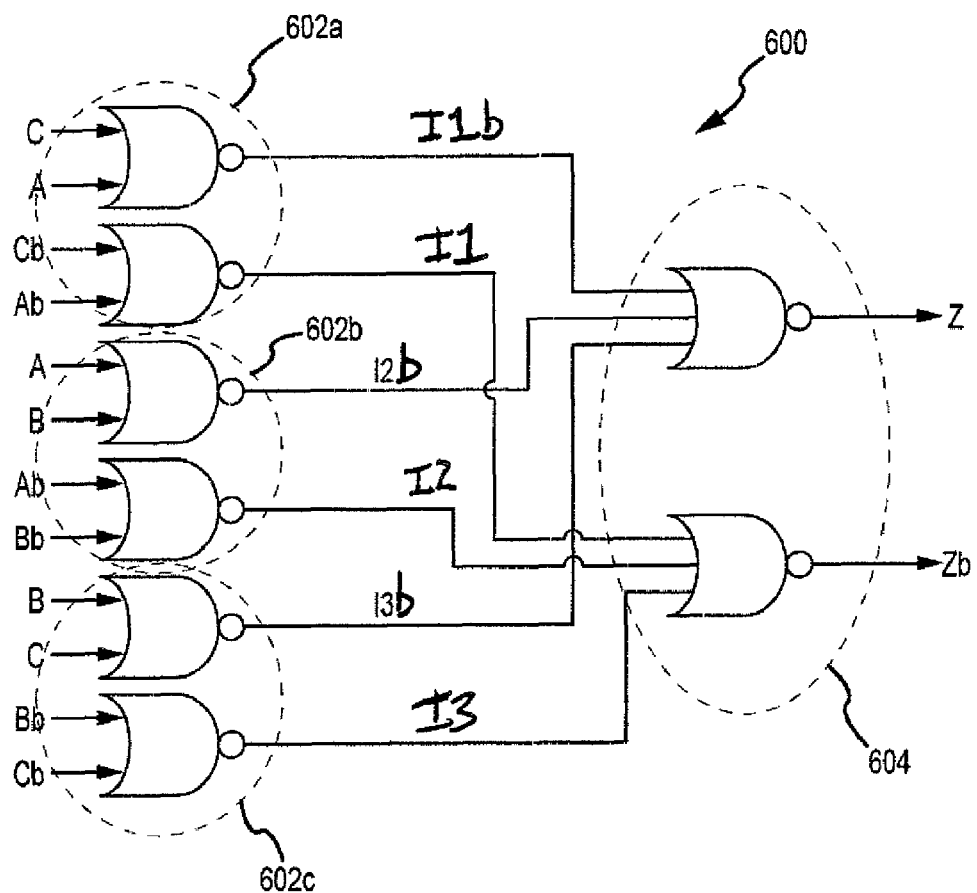
FIG. 6 is a schematic of a hardened current mode logic voter according to one embodiment of the present invention.

FIG. 6 is a schematic of a hardened current mode logic voter circuit 600 including three two-input split NOR gates 602a-c that apply their outputs to a three-input split NOR gate 604 according to one embodiment of the present invention. The voter circuit 600 is utilized in electronic circuitry and systems in place of the voter 400 of FIG. 4. In operation, the voter circuit 600 enables the utilization of triple mode redundancy in current mode logic circuitry without propagating any errors that may arise due to single event upsets, as will be explained in more detail below.

In the following description, certain details are set forth in conjunction with the described embodiments of the present invention to provide a sufficient understanding of the invention. One skilled in the art will appreciate, however, that the invention may be practiced without these particular details. Furthermore, one skilled in the art will appreciate that the example embodiments described below do not limit the scope of the present invention, and will also understand that various modifications, equivalents, and combinations of the disclosed embodiments and components of such embodiments are within the scope of the present invention. Embodiments including fewer or more than all the components of any of the respective described embodiments may also be within the scope of the present invention although not expressly described in detail below. Finally, the operation of well known components and/or processes has not been shown or described in detail below to avoid unnecessarily obscuring the present invention.

Each of the two-input split NOR gates 602a-c receives two corresponding pairs of complementary input signals A, Ab, B, Bb, C, Cb from modules (not shown) that form the actual circuitry being protected. Each two-input split NOR gate 602a-c generates a corresponding pair of complementary outputs I1, I1b, I2, I2b, and I3, I3b. Note that while selected signals are described as being complementary signals, single event upsets can result in such signals not being complementary and thereby result in invalid logic conditions, as previously discussed above. The three-input split NOR gate 604 receives the complementary outputs I1, I1b, I2, I2b, and I3, I3b from the two-input split NOR gates 602a-c and generates a complementary pair of output signals Z, Zb in response to the output signals from the two-input split NOR gates.

In operation of the voter circuit 600, it is assumed that only one pair of input signals (e.g., A, Ab) can be corrupted at a time since, as discussed above, the likelihood of a single event upset condition affecting two or more modules (not shown) coupled to the voter circuit is extremely low. Furthermore, it is assumed that only one of the split NOR gates 602a-c can be hit by a single event upset at time. In one embodiment, the three-input split NOR gate 604 is formed from hardened current mode logic buffers (not shown) and is therefore immune to single event upsets. The two-input split NOR gate 602a implements the following logic function:

$$I1=(Ab+Cb)'+(AbCb)'(AC)$$

$$I1b=(A+C)'+(AC)'(AbCb)$$

The same is true for the split NOR gates 602b-c and their corresponding inputs, so only the gate 602a is discussed in more detail. When the input signals A, Ab and C, Cb are complementary, as they should be under normal operating conditions with no single event upsets, then the split NOR gate 602a functions as a simple NOR gate. When this is not true and a single event upset had corrupted one of the input signals A, Ab or C, Cb, the two-input NOR gate 602a rejects (0,0) and (1,1) input conditions for the corrupted input signal and outputs the correct values for the outputs I1, I1b. For example, if the input signals A, Ab are (0,0) or (1,1) and the C, Cb signals are a valid (0,1) or (1,0), then in this situation the gate 602a outputs for I1, I1b the inverted correct values of either (1,0) or (0,1) of the valid input signal C, Cb. Finally, the split NOR gate 602a outputs a (0,0) value for the output signals I1, I1b when the input signals A,Ab, and C, Cb are mismatched. The input signals A, Ab and C, Cb are considered mismatched when the signals of each input signal are complementary so that the input signal is valid but the input signals have different values. For example, if input signal A, Ab is (0, 1) and input signal C, Cb is (1, 0) then the split NOR gate 602a outputs a (0, 0) value for output signals I1, I1b. The same is true if input signal A, Ab is (1, 0) and input signal C, Cb is (0, 1). Thus, by forming the two-input split NOR gates 602a-c to implement the above logic functions, each of the gates operates as just described responsive to the corresponding input signals.

The three-input split NOR gate 604 functions similarly to the two-input split NOR gate 602a as just described. The gate 604 rejects the (0, 0) condition on two of the three pairs of signals I1,I1b, I2,I2b, and I3,I3b from the two-input split NOR gate 602a-c. In this situation, the gate 604 generates correct values for the output signals Z,Zb from the third pair of signals I1,I1b, I2,I2b, and I3,I3b having the correct value. For example, if the signals I2,I2b, and I3,I3b have the invalid (0,0) condition and the signal I1, I1b has the value (0, 1) then the gate 604 outputs (1,0) for the signals Z, Zb, which corresponds to the complement of the valid (0, 1) state for the valid signal I1, I1b. In this way, the hardened current mode logic voter circuit 600 does not propagate errors to circuitry downstream of the voter circuit.

Figure 7:
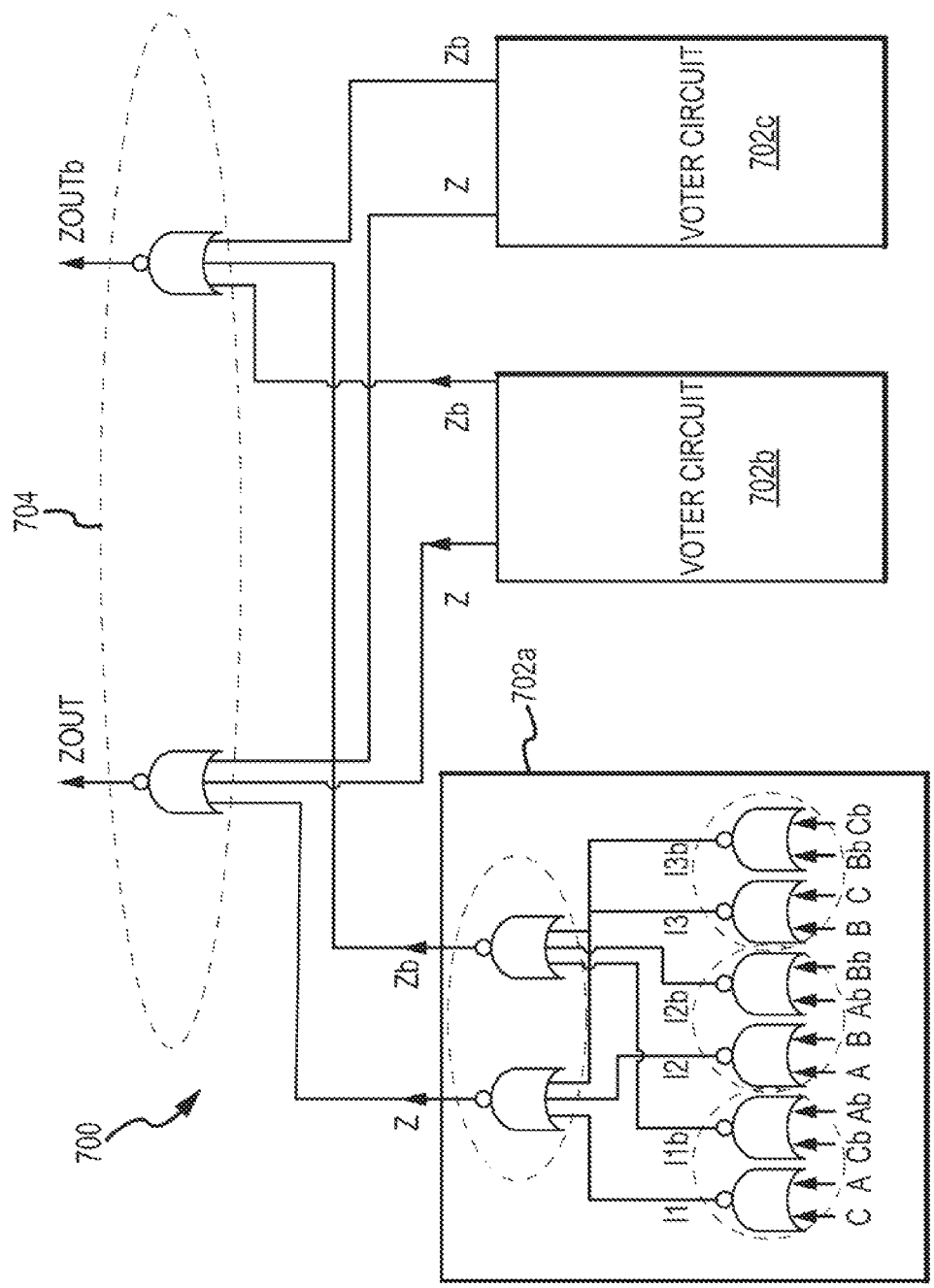
FIG. 7 is a schematic of a hardened current mode logic voter 700 according to another embodiment of the present invention.

FIG. 7 is a schematic of a hardened current mode logic voter circuit 700 according to another embodiment of the present invention. The voter circuit 700 includes three voters circuits 702a-c, each voter circuit corresponding to the voter circuit 600 of FIG. 6 with only the voter circuit 702a being shown in detail in the figure. The outputs Z, Zb from each of these voter circuits 702a-c is supplied to an additional three-input split NOR gate 704 which, in turn, generates outputs ZOUT,ZOUTb in response to these outputs from the individual voter circuits. With the voter circuit 700, even better resistance to single event upsets is provided since the overall voter circuit will still operate properly even if one of the underlying assumptions previously discussed with reference to the voter circuit 600 of FIG. 6 does not turn out to be true. For example, in the event two or more of the two-input split NOR gates (shown only for the voter circuit 702a in FIG. 7 but contained in 702b and 702c as well) contained in the voter circuits 702a-c experiences a single event upset the overall voter circuit 700 will still operate properly and not propagate any error conditions.

Figure 1:
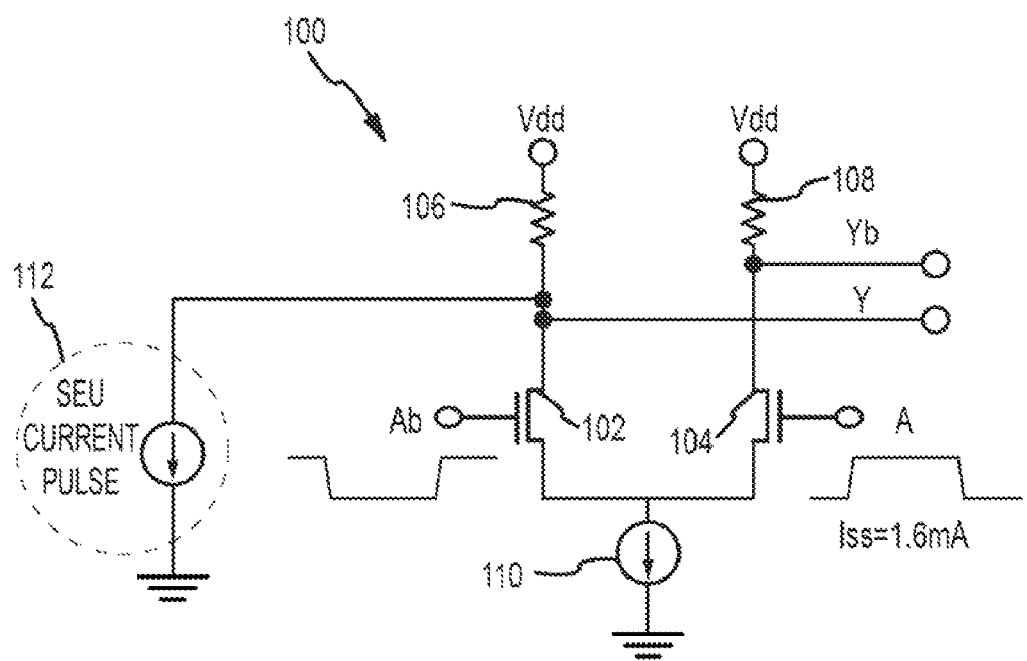
FIG. 1 is a schematic diagram of a conventional current mode logic buffer showing the effect of a single event upset on the operation of the buffer.
Figure 2:
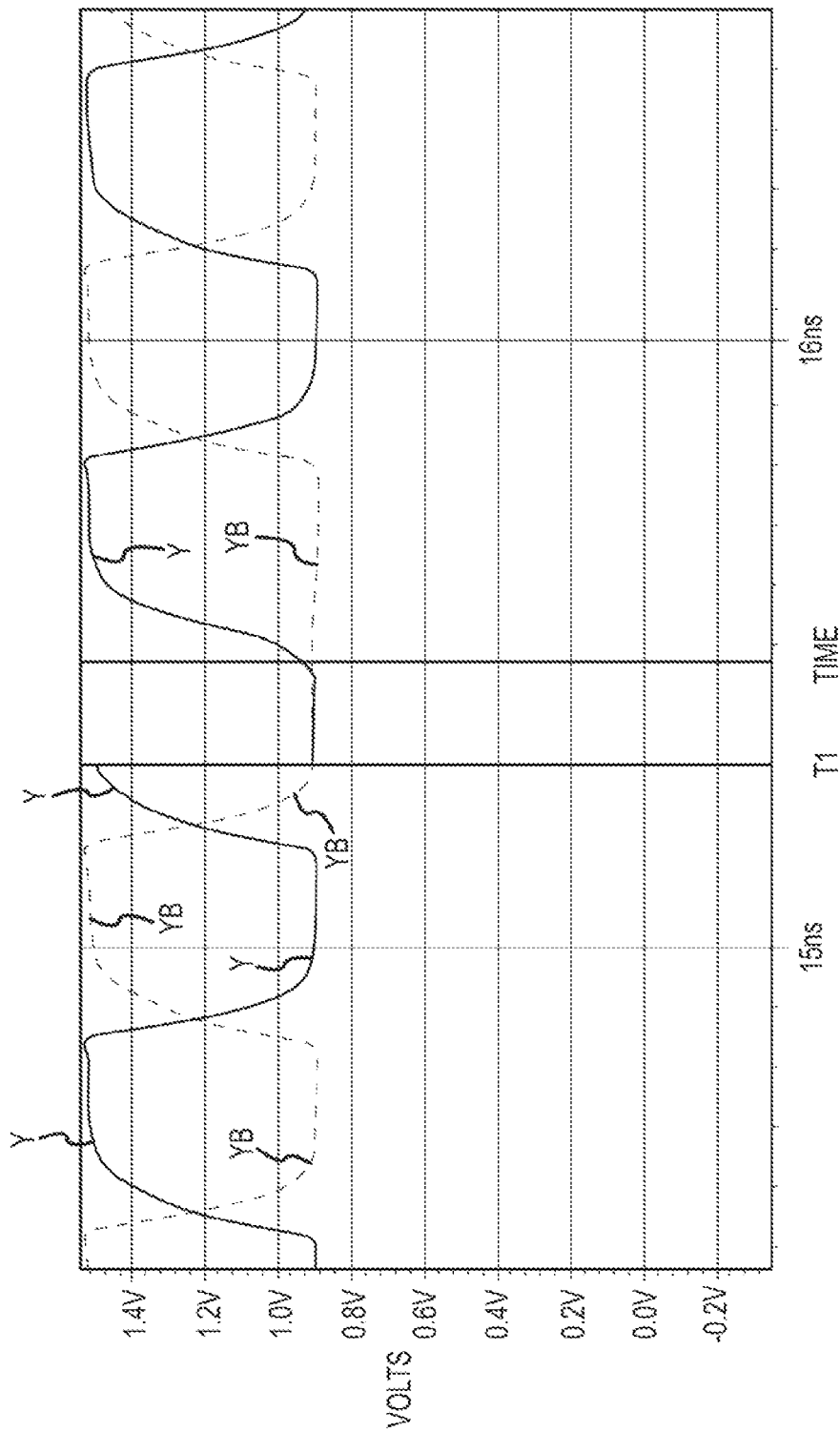
FIG. 2 is a signal diagram showing the effects of a single event upset on the complementary output signals from the buffer of FIG. 1.
Figure 3A:
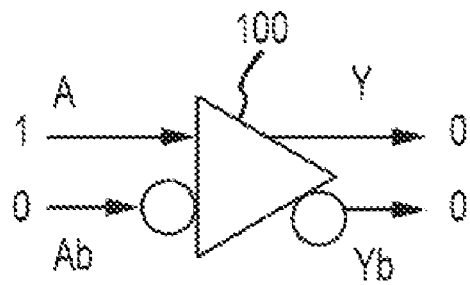
FIGS. 3A-3C depict the affects of a single event upset on the buffer and the propagation of invalid logic conditions by such conventional buffers in response to a single event upset.
Figure 3B:
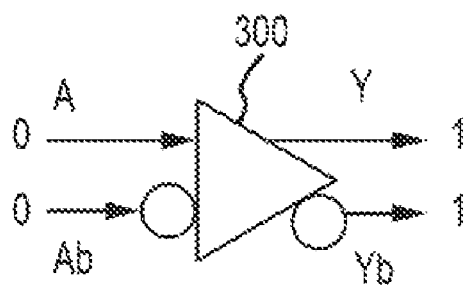
Figure 3C:
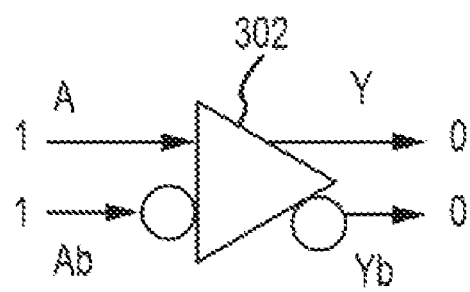
Figure 8:
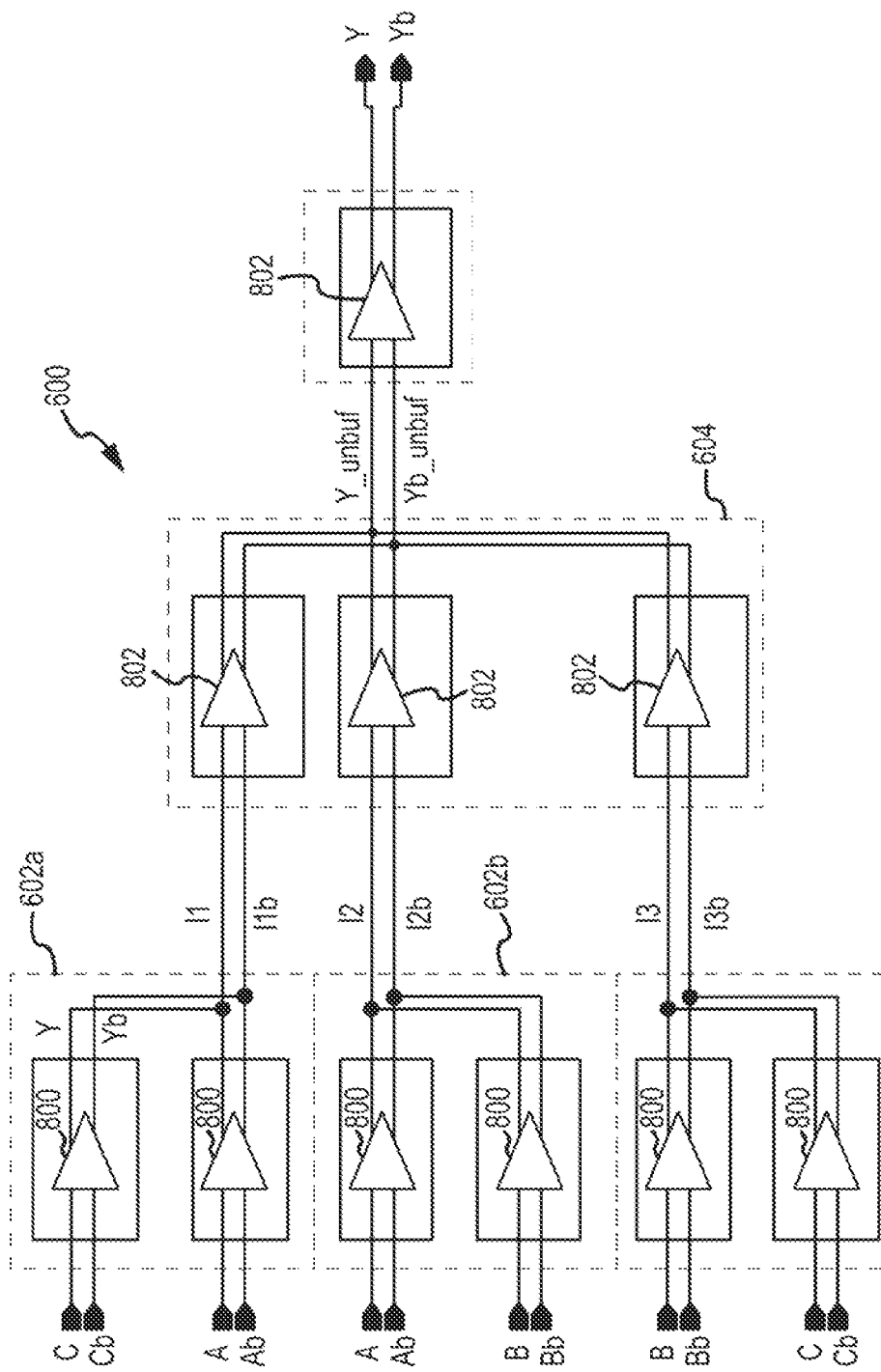
FIG. 8 is a schematic illustrating the voter 600 of FIG. 6 in more detail according to one embodiment of the present invention.

FIG. 8 is a schematic illustrating the voter circuit 600 of FIG. 6 in more detail according to one embodiment of the present invention. In this embodiment, each of the two-input split NOR gates 602a-c is formed by a pair of parallel-connected current mode logic buffers 800. Each buffer 800 corresponds to the conventional buffer 100 previously described with reference to FIG. 1. The three-input split NOR gate 604 is formed by three parallel-connected hardened current mode logic buffers 802 as shown. The hardened current mode logic buffers 802 will be described in more detail below. Finally, note that the embodiment of FIG. 8 includes an additional hardened current mode logic buffer 802 that receives the output signals Z, Zb from the three-input split NOR gate 604 and provides a complimentary output signals Y, Yb in response thereto. The embodiment of the voter circuit 600 enables well known and understood circuit component, namely the conventional buffers 100, to be utilized in forming part of the voter circuit.

Figure 9:
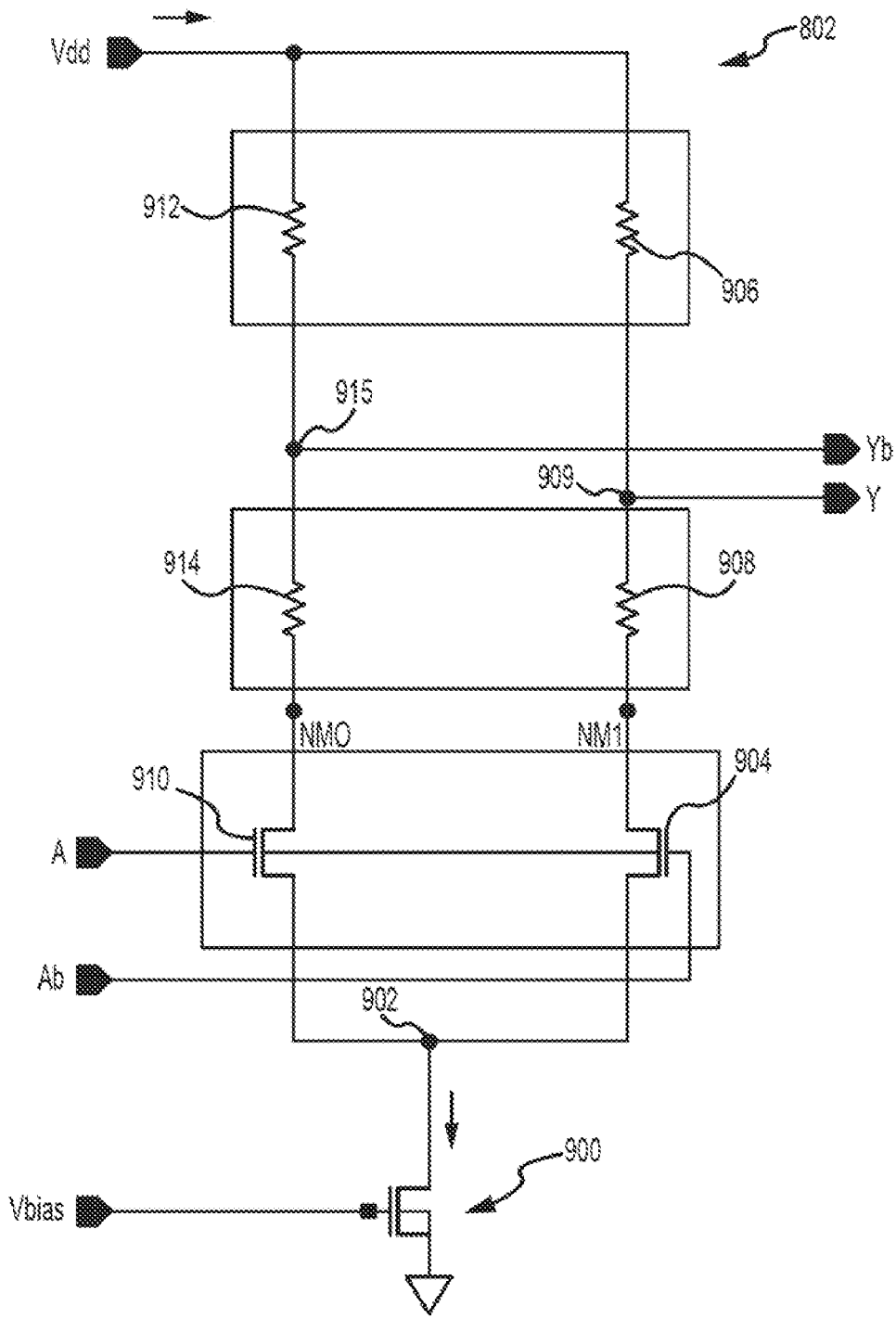
FIG. 9 is a schematic illustrating one embodiment of the hardened buffer circuits of FIG. 8.

FIG. 9 is a schematic illustrating one embodiment of the hardened buffer circuits 802 of FIG. 8. The buffer circuit 802 includes a current source 900 coupled between ground and a first node 902, with a first NMOS transistor 904 coupled in series with a first pull-up resistor 906 and a first isolation resistor 908 between the first node and a supply voltage node that receives a supply voltage Vdd. The first NMOS transistor 904 receives a first complementary input signal Ab on a gate node and generates a first output signal Y on an output node in response to the first input signal. The buffer circuit 802 further includes a second NMOS transistor 910 coupled in series with a second pull-up resistor 912 and a first isolation resistor 914 between the first node 902 and the supply voltage node that receives the supply voltage Vdd. The second NMOS transistor 910 receives a second complementary input signal A on a gate node and generates a second output signal Yb on a complementary output node 915 in response to the second complementary input signal.

In operation, the isolation resistors 908 and 914 isolate or decouple the drain nodes of the transistors 904 and 910 from the output nodes 909, 915 on which the signals Y and Yb, respectively, are developed. As a result, a single event upset on one of the drain nodes does not pull the corresponding output node down so quickly, but more slowly at a rate determined by the value of the isolation resistor 908, 914 and the capacitance of the output node. Moreover, in one embodiment the buffer 802 includes a number of the buffers coupled in parallel so that in the event one of the circuits experiences a single event upset, the remaining fifteen other circuits continue driving the output node at the proper logic level. Sixteen buffers 802 are coupled in parallel in one embodiment of the present invention.

Figure 10:
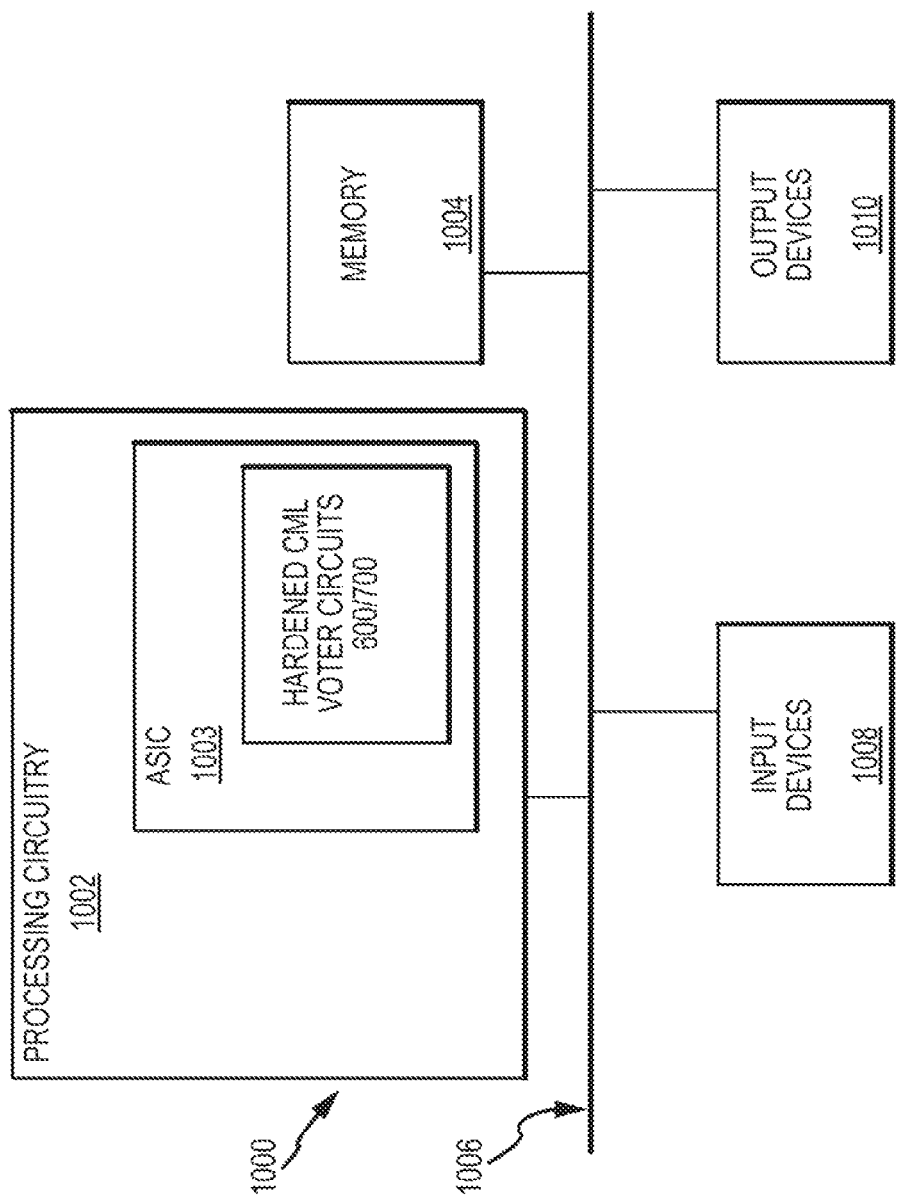
FIG. 10 is a functional block diagram of an electronic system including hardened current mode logic voter circuits of FIGS. 6 and/or 7 according to another embodiment of the present invention.

The voter circuit 600 of FIG. 6 and the voter circuit 700 of FIG. 7 may be utilized in a variety of different types of electronic circuits, such as phased locked loops and phase interpolators which, in turn, can themselves be contained in a variety of different types of electronic systems. FIG. 10 is a functional block diagram of an electronic system 1000 including the hardened current mode logic voter circuits of FIGS. 6 and/or 7 according to another embodiment of the present invention. The electronic system 1000 includes processing circuitry 1002 that is shown as including an application specific integrated circuit (ASIC) 1003 that, in turn, includes the voter circuits 600 and/or 700 in the embodiment of FIG. 10. In one embodiment, the ASIC 1003 includes a serializer/deserializer (SERDES) that, in turn, includes the voter circuits 600 and/or 700. The processing circuitry 1000 is coupled to a memory 1004 through a bus 1006. Data and any programs being executed by the processing circuitry 1002 may be stored in the memory 1004. The electronic system 1000 further includes input devices 1008 and output devices 1010 coupled to the processing circuitry via the bus 1006. The inputs devices 1008 may include a receiver circuitry including an antenna for receiving and conditioning transmitted signals and the output devices 1010 may similarly include an antenna and associated transmitter circuitry for transmitting signals to a remote location. Furthermore, note that depending on the specific application of the system 1000 the components 1002-1010 may be integrated in a single semiconductor chip or may be contained on a common carrier such as a printed circuit board. Also, depending on the application of the system 1000, the hardened current mode logic voter circuits 600/700 may be contained not only in the processing circuitry 1002 but may also be contained in other components of the system 100 such as the memory 1004, input devices 1008, and output devices 1010.

Even though various embodiments and advantages of the present invention have been set forth in the foregoing description, the above disclosure is illustrative only, and changes may be made in detail and yet remain within the broad principles of the present invention. Moreover, the functions performed by components in the voters 600 and 700 may be combined to be performed by fewer elements, separated and performed by more elements, or combined into different functional blocks in other embodiments of the present invention. Also, other embodiments of the present invention are directed to other than triple-mode redundancy and include components having different numbers of inputs, such as the split NOR gates 604 of FIG. 6 where, for example, each of the gates could include N inputs instead of three inputs as in this embodiment where N equals 2 and any integer greater than 3. Therefore, the present invention is not to be limited by the above description of embodiments thereof but only by the appended claims.

What is claimed is:

1. A current mode logic voter circuit, comprising:
    a plurality of N-input split NOR gates and a plurality of M-input split NOR gates, the NOR gates operable in combination as a voter circuit for M mode redundancy in current mode logic circuitry without propagating errors that arise due to single event upset conditions;
    wherein each of the N-input split NOR gates comprises a plurality of hardened current mode logic buffer circuits; and
    wherein each hardened current mode logic buffer circuit comprises:
        a current source adapted to be coupled between a first node and a voltage reference node;
        a first NMOS transistor coupled in series with a first pull-up resistor and a first isolation resistor between the first node and a supply voltage node, the first NMOS transistor adapted to receive a first input signal on a gate node and operable to generate a first output signal on a drain node; and
        a second NMOS transistor coupled in series with a second pull-up resistor and a second isolation resistor between the first node and the supply voltage node, the second NMOS transistor adapted to receive a second input signal on a gate node and operable to generate a second output signal on a drain node.

2. A current mode logic voter circuit including a plurality of N-input split NOR gates and a plurality of M-input split NOR gates, the NOR gates operable in combination as a voter circuit for M mode redundancy in current mode logic circuitry without propagating errors that arise due to single event upset conditions; and wherein, each of the N-input split NOR gates comprises at least two current mode logic buffer circuits having outputs coupled in common; and each M-input split NOR gate comprises at least three current mode logic buffer circuits having outputs coupled in common.

3. The current mode logic voter circuit of claim 2, wherein N equals two and M equals three, and wherein the voter circuit further comprises:
    three two-input split NOR gates, each two-input split NOR gate adapted to receive corresponding pairs of complementary input signals and operable to generate a pair of first output signals responsive to the pairs of complementary input signals; and
    a three input split NOR gate, the three input split NOR gate coupled to the two-input split NOR gates to receive the first output signals and operable to generate a second pair of output signals responsive to the first output signals from the two-input split NOR gates.

4. The current mode logic voter circuit of claim 2 further comprising:
    three of the current mode logic voter circuits; and
    a second three input split NOR gate, each input of the three input split NOR gate having an input coupled to receive the second pair of output signals from a corresponding current mode logic voter circuit, and the second three input split NOR gate operable to generate a third pair of output signals responsive to the second pairs of output signals from the three current mode logic voter circuits.

5. An electronic system, comprising:
    processing circuitry including a plurality of current mode logic voter circuits, each voter circuit including a plurality of N-input split NOR gates and a plurality of M-input split NOR gates, the NOR gates operable in combination as a voter circuit for M mode redundancy in current mode logic circuitry without propagating errors that arise due to single event upset conditions;
    memory coupled to the processing circuitry;
    input devices coupled to the processing circuitry; and
    output devices coupled to the processing circuitry.

6. The electronic system of claim 5, wherein N equals two and M equals three.

7. The electronic system of claim of claim 5 wherein N equals two and M equals three, and wherein the voter circuit further comprises:
    three two-input split NOR gates, each two-input split NOR gate adapted to receive a corresponding pair of input signals and operable to generate a pair of first output signals responsive to the input signals; and
    a three input split NOR gate, the three input split NOR gate coupled to the two-input split NOR gates to receive the first output signals and operable to generate a second pair of output signals responsive to the first output signals from the two-input split NOR gates.

8. The electronic system of claim 7 wherein the three input split NOR gate comprises a plurality of hardened current mode logic buffer circuits.

9. The electronic system of claim 8 wherein,
    each of the two-input split NOR gates comprises a pair of current mode logic buffer circuits coupled in parallel; and
    the three-input split NOR gate comprises three current mode logic buffer circuits coupled in parallel.

10. The electronic system of claim 7 further comprising:
    three current mode logic voter circuits; and a second three input split NOR gate, each input of the three input split NOR gate having an input coupled to receive the second pair of output signals from a corresponding current mode logic voter circuit, and the second three input split NOR gate operable to generate a third pair of output signals responsive to the second pairs of output signals from the three current mode logic voter circuits.

11. The electronic system of claim 5 wherein N equals two and M equals three.

12. An electronic system, comprising:
processing circuitry including a plurality of current mode logic voter circuits, each voter circuit including a plurality of N-input split NOR gates and a plurality of M-input split NOR gates, the NOR gates operable in combination as a voter circuit for M mode redundancy in current mode logic circuitry without propagating errors that arise due to single event upset conditions;
memory coupled to the processing circuitry;
input devices coupled to the processing circuitry;
output devices coupled to the processing circuitry; and
wherein the processing circuitry further comprises an application specific integrated circuit, the application specific integrated circuit including at least some of the plurality of current mode logic voter circuits.

13. The electronic system of claim 12 wherein the application specific circuit includes serializer/deserializer circuitry, the serializer/deserializer circuitry including at least some of the voter circuits.

14. The electronic system of claim 12, wherein each of the N-input and M-input split NOR gates comprises a plurality of hardened current mode logic buffer circuits.

15. An electronic system, comprising:
processing circuitry including a plurality of current mode logic voter circuits, each voter circuit including a plurality of N-input split NOR gates and a plurality of M-input split NOR gates, the NOR gates operable in combination as a voter circuit for M mode redundancy in current mode logic circuitry without propagating errors that arise due to single event upset conditions;
memory coupled to the processing circuitry;
input devices coupled to the processing circuitry;
output devices coupled to the processing circuitry;
wherein the voter circuit further comprises:
three two-input split NOR gates, each two-input split NOR gate adapted to receive a corresponding pair of input signals and operable to generate a pair of first output signals responsive to the input signals; and
a three input split NOR gate, the three input split NOR gate coupled to the two-input split NOR gates to receive the first output signals and operable to generate a second pair of output signals responsive to the first output signals from the two-input split NOR gates;
wherein the three input split NOR gate comprises a plurality of hardened current mode logic buffer circuits; and
wherein each hardened current mode logic buffer circuit comprises:

a current source adapted to be coupled between a first node and a voltage reference node;
a first NMOS transistor coupled in series with a first pull-up resistor and a first isolation resistor between the first node and a supply voltage node, the first NMOS transistor adapted to receive a first input signal on a gate node and operable to generate a first output signal on a drain node; and
a second NMOS transistor coupled in series with a second pull-up resistor and a second isolation resistor between the first node and the supply voltage node, the second NMOS transistor adapted to receive a second input signal on a gate node and operable to generate a second output signal on a drain node.

16. A method of providing triple mode redundancy in current mode logic circuitry without propagating errors that arise due to single event upset conditions, the method comprising:
providing three paths for at least some logic signals in the current mode logic circuitry; and
receiving logic signals A, Ab, for the first path, B, Bb for the second path, and C, Cb for the third path;
for each of the three pairs of logic signals, generating output signals I, Ib responsive to the logic signals according to the following functions:

$$I=(Xb+Yb)'+(XbYb)'(XY)$$

$$Ib=(X+Y)'+(XY)'(XbYb)$$

where X,Y are either (A, B), (A, C), or (B, C); and
processing the output signals I, Ib from each path to generate overall output signals having the proper logic state;
wherein processing the output signals I, Ib from each path to generate overall output signals having the proper logic state comprises processing the output signals using according to a three-input split NOR logic function; and
wherein the three-input split NOR logic function is provided by a hardware circuit formed from current mode logic buffer circuits, each current mode logic buffer circuit having two output nodes and wherein the method further comprise hardening each current mode logic buffer circuit by isolating each output node from a component in the buffer circuit driving that output node.

17. The method of claim 16 wherein processing the output signals I, Ib from each path to generate overall output signals having the proper logic state comprises processing the output signals using according to a three-input split NOR logic function.

18. The method of claim 16 wherein isolating each output node from a component in the buffer circuit driving that output node comprises providing a resistance between each output node and the component driving that output node.

19. The method of claim 16, the method further comprises providing additional paths and processing logic signals associated with these additional paths in combination with the logic signals of the three paths.

* * * * *